United States Patent [19]

Baglee

[11] Patent Number: 4,975,384
[45] Date of Patent: Dec. 4, 1990

[54] ERASABLE ELECTRICALLY PROGRAMMABLE READ ONLY MEMORY CELL USING TRENCH EDGE TUNNELLING

[75] Inventor: David A. Baglee, Houston, Tex.

[73] Assignee: Texas Instruments Incorporated, Dallas, Tex.

[21] Appl. No.: 217,183

[22] Filed: Jul. 11, 1988

Related U.S. Application Data

[62] Division of Ser. No. 869,497, Jun. 2, 1986, Pat. No. 4,796,228.

[51] Int. Cl.[5] .............................................. H01L 29/94
[52] U.S. Cl. ......................................... 437/43; 437/52
[58] Field of Search ..................... 437/52, 43; 357/23.5

[56] References Cited

U.S. PATENT DOCUMENTS

| | | | |
|---|---|---|---|
| 4,222,063 | 9/1980 | Rodgers | 357/45 |
| 4,364,074 | 12/1982 | Garnache et al. | 357/23.5 |
| 4,502,208 | 3/1985 | McPherson | 357/23.5 |

FOREIGN PATENT DOCUMENTS

| | | | |
|---|---|---|---|
| 59-61188 | 4/1984 | Japan | 357/23.5 |
| 60-167376 | 8/1985 | Japan | 357/23.5 |

*Primary Examiner*—Olik Chaudhuri
*Attorney, Agent, or Firm*—Theodore D. Lindgren

[57] ABSTRACT

An electrically programmable read only memory cell formed in a face of a semiconductor substrate which includes a floating gate transistor having a floating gate and a control gate formed at least partially in a trench in the substrate. The trench has bottom corners sufficiently sharp so as to enhance the likelihood of tunnelling between corner regions of the trench and the floating gate over that between planar surface regions of the trench and floating gate.

3 Claims, 4 Drawing Sheets

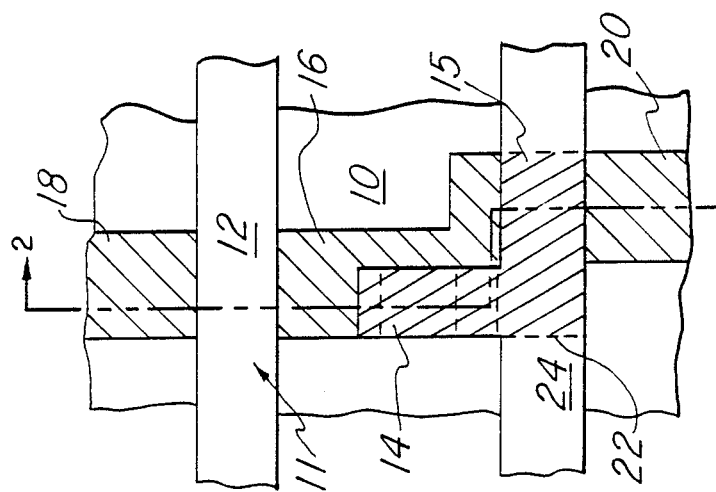
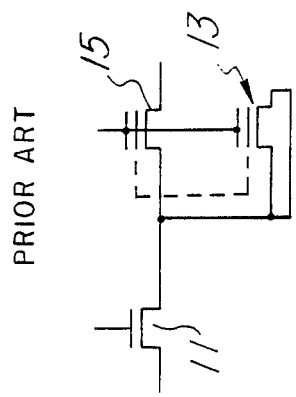
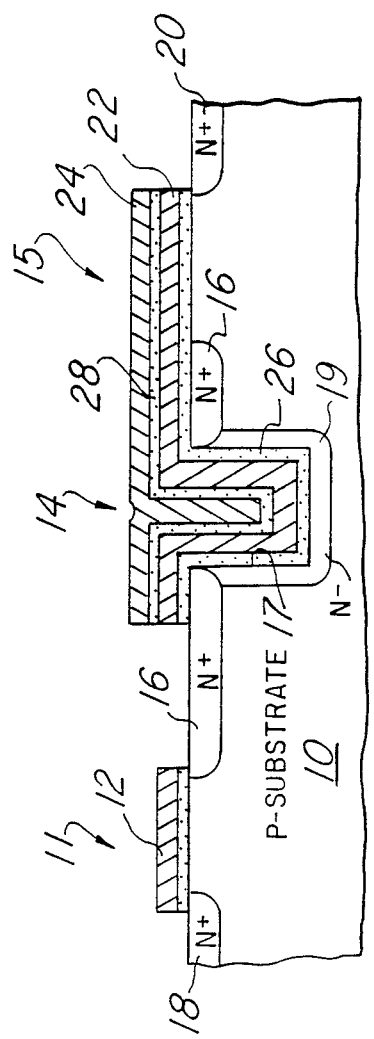

ERASABLE ELECTRICALLY PROGRAMMABLE READ ONLY MEMORY CELL USING TRENCH EDGE TUNNELLING

This application is related to my co-pending application Ser. No. 869,497, filed June 2, 1986, and also assigned to Texas Instruments Incorporated and this application is a division of Ser. No. 869,497 filed June 2, 1986 now U.S. Pat. No. 4,796,228 issued Jan. 3, 1989.

BACKGROUND OF THE INVENTION

The present invention relates to an erasable electrically programmable read only memory cell of a type used in VLSI technology.

Convention erasable electrically programmable read only memory cells (EEPROM's) use three transistors per cell and occupy an area on a chip or wafer of the order of 300 square microns. Their large size is due to the requirement of obtaining a good coupling to the floating gate from the control gate of the floating gate transistor used in the cell so that any voltage applied to the control gate will result in a relatively large voltage on the floating gate. One way of achieving this large coupling is to make the capacitance present between the control gate and the floating gate large relative to that between the floating gate and the channel. Any attempt to reduce the thickness of the interlevel oxide between the floating gate and the control gate to increase the capacitance across these electrodes results in a deterioration in the data retention of the device. Increasing the size of the control gate and floating gate in order to increase this capacitance takes up valuable surface area on the chip.

Accordingly, it is an object of the present invention to provide an improved EEPROM cell structure. It is a further object to provide an EEPROM cell which is smaller than presently known structures.

SUMMARY OF THE INVENTION

According to the invention there is provided an EEPROM cell which includes a floating gate and control gate formed in a trench. By using a three dimensional trench structure a relatively large area is achieved without taking up too much chip surface area.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a circuit diagram of an erasable electrically programmable read only memory cell;

FIG. 2 is a sectional view greatly enlarged taken along the line 2—2 shown in FIG. 3 below;

FIG. 3 is a plan view of the erasable electrically programmable read only memory cell in accordance with a preferred embodiment of the invention.

DETAILED DESCRIPTION WITH REFERENCE TO THE DRAWINGS

Figure 4:
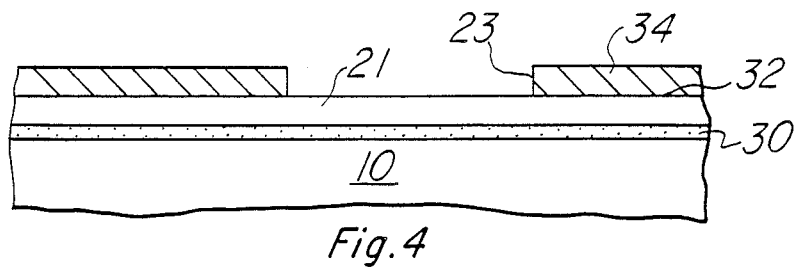
FIGS. 4–15 show the erasable electrically programmable read only memory cell in various stages of manufacture.

Referring to FIG. 1 there is shown a circuit diagram of an erasable electrically programmable read only memory cell of the three transistor type which includes a selection transistor 11, a floating gate transistor 15 and a tunnel device 13 coupled to the source of the floating gate transistor 15. The floating gates and the control gates of tunnel device 13 and of floating ate transistor 15, respectively, are coupled together. In operation selection transistor 11 is turned on by the application of a high level signal to its gate. Then if the drain of the floating gate transistor 15 is high and a SENSE voltage of typically 2 volts is applied to the control gate of transistor 15, the latter will conduct if in an unprogrammed condition. In order to program the EEPROM it is necessary to raise its control gate voltage to a programming voltage which may range from about 12 volts to about 25 volts depending on the structure of the device and at the same time ground the source. This is accomplished by grounding the source of selection transistor 11 and turning on the latter so that its source is also at or near ground thereby placing the source of floating gate transistor 15 at or near ground. The high voltage across the tunnel floating gate and channel of the tunnel device initiates electron tunnelling onto the floating gate of the latter. Such tunnelling continues until the negative charge on the floating gate prevents further tunnelling. Then when a sense voltage is applied to the control gate of the floating gate transistor 15 as before, the negative charge on the floating gate prevents the latter transistor from conducting. The negative charge can be removed by reversing the voltage across the control gate and source of transistor 15 by applying the programming voltage to the source of transistor 15 through transistor 11 and ground on the control gate of transistor 15 and tunnel device 13.

In order to maximize the programming effect of a voltage applied across the control gate and source of the tunnel device it is desirable to maximize the coupling between the control gate and the floating gate. Ordinarily, it is undesirable to attempt to reduce the thickness of interlevel oxide between the floating gate and control gate in order to increase the capacitance between the two as this causes a deterioration of the data retention capability of the cell. Thus, the area of the latter capacitance must be increased. It is also advantageous to be able to use a relatively thick oxide between the channel 19 and trench 17 of the order of 250 to 350 Angstroms so as to avoid the need to carefully control gate oxide thickness and increased susceptibility to data retention deterioration.

Referring to FIG. 2 there is shown in cross section greatly enlarged a three dimensional trench structure 14 for the floating gate and control gate designed to maximize capacitance area but keep the surface area of the chip used by these electrodes to a minimum. In this case a trench 17 having relatively sharp bottom edge is etched in a silicon substrate 10 and a thin oxide layer grown over the surface of the trench and on the substrate. A polysilicon floating gate 33 extends over the substrate surface and into the trench 17 separated from the latter by a thin approximately 350 Angstrom layer of oxide 26 and separated from an overlying polysilicon control gate 24 by a layer of interlevel oxide 28 in the range of 300 to 500 Angstroms thick. In fact the thickness of oxide 26 may range from about 100 Angstroms to about 500 Angstroms. A shallow diffused $N^-$ type conductivity region extends around the trench from an $N^+$ type conductivity region 16 on one side to a region 16 on the other side thereof.

As seen in the top view of FIG. 3 of the cell the polysilicon of the floating gate of the tunnel device 14 extends over to the floating gate of floating gate transistor 15 and the polysilicon control gate of tunnel device 14 extends over to the control gate of transistor 15 as well. A N+-type conductivity moat 16 surrounds the trench 17 on three sides and also forms the source for transistor 15. Polysilicon strips 12 and 24 which form the gate of transistor 11 and the control gate of floating gate transistor 15 run parallel to each other to couple to other cells in an array of such cells. Additional N+ moat regions 18 and 20 form the source and drain of transistors 11 and 15, respectively. The jog in moat region 16 seen in FIG. 3 allows a means for varying contact position that is required by metal conductor line placement. However, there is no reason other than this for using such a jog. Typical dimensions of the trench 17 are 4 microns long, 3 microns wide and 1 micron deep. With a polysilicon thickness of about 0.4 microns this gives an increased capacitance area between floating gate and control gate in the trench over that which would exist if there were no trench over the trench region of approximately 50%.

Functionally, electron tunnelling occurs at the corners of the trench 17 from the N-type region 16 to the floating gate 22 due to the presence at these regions of high field concentrations. Alternatively, reliance could also be made on tunnelling across a thin oxide layer between the floating gate 22 and a surface of the substrate 10 over N+ layer 16.

Figure 5:
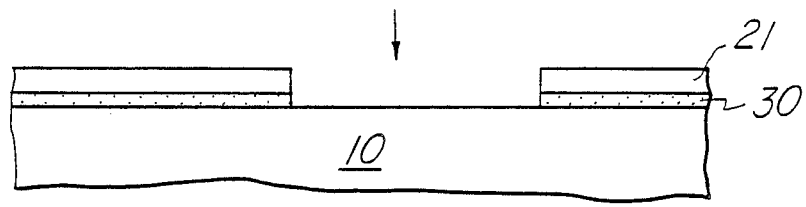
Figure 6:
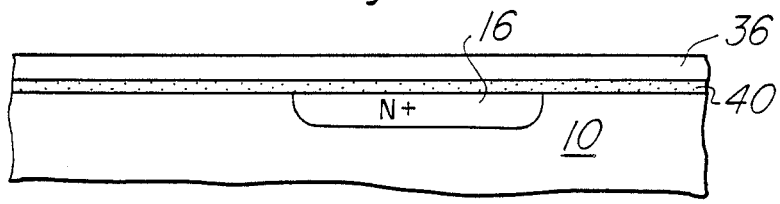
Figure 7:
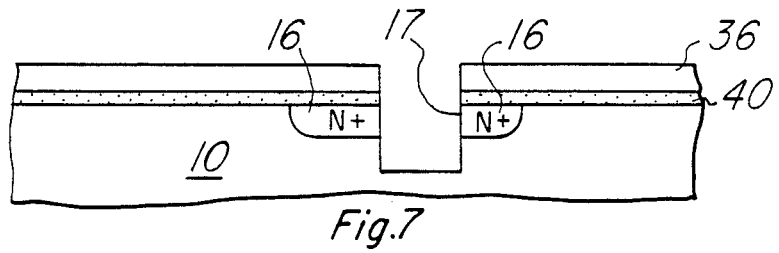
Figure 8:
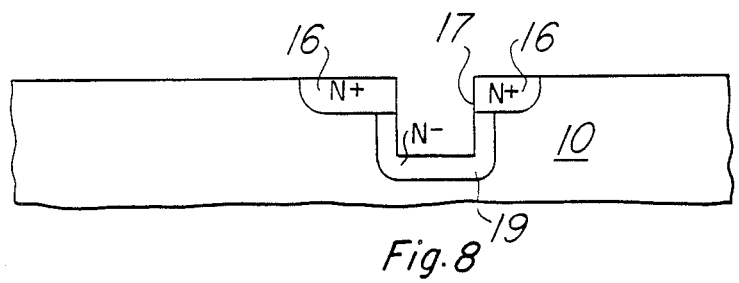
Figure 9:
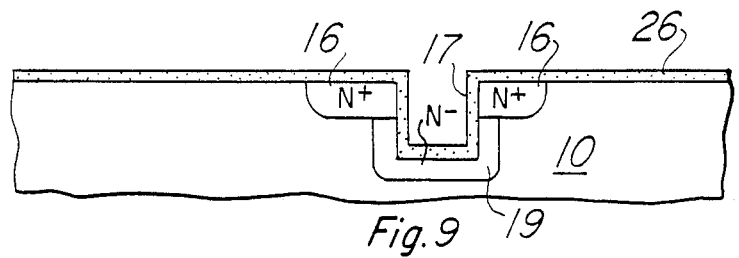
Figure 10:
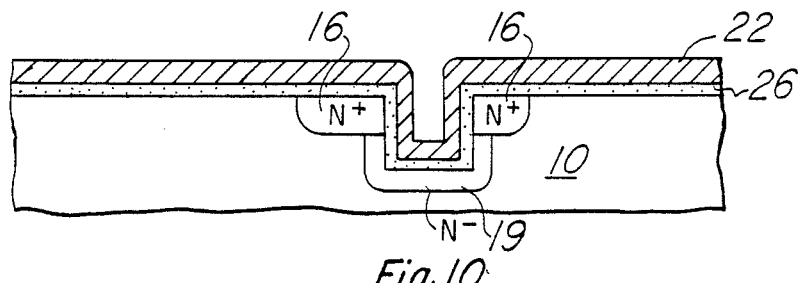
Figure 11:
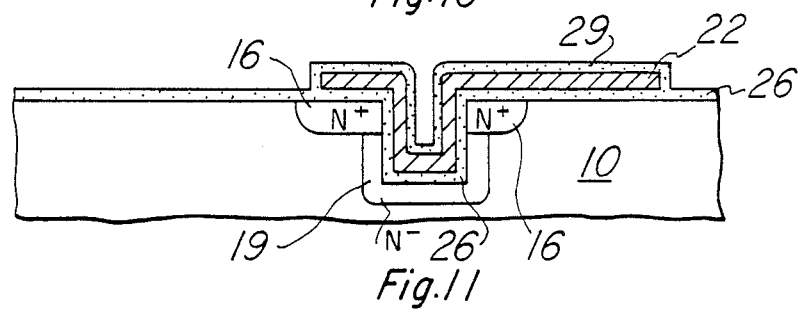
Figure 12:
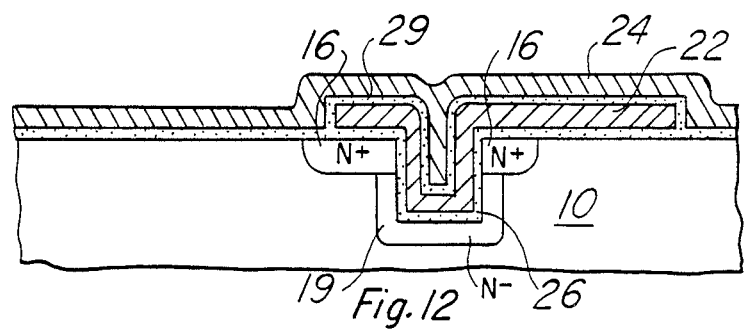

The fabrication process shown in FIGS. 4 to 5 consists of first growing a thin layer of silicon dioxide 30 over a P-type substrate 10 by placing the device in a steam atmosphere at a temperature of 1,000° C. for about 15 minutes. Then a layer of silicon nitride 32 about 0.1 microns thick is deposited over the oxide 30, patterned with photoresist 34 to form an opening 23, for an N+ moat 16 as seen in FIG. 5. The nitride 21 and oxide 30 in opening 23 is then etched off and the top opening of the cell is then subjected to an implant of arsenic at 90–150 keV to a dose of $0.5-1 \times 10^{16}$ atoms per square centimeter. This step is followed by a high temperature anneal to activate the implant to form N+ area 16 and to anneal any implant damage. The oxide 30 and nitride 21 layers are then removed and new oxide 40 and nitride 36 are grown and deposited, respectively.

Figure 13:
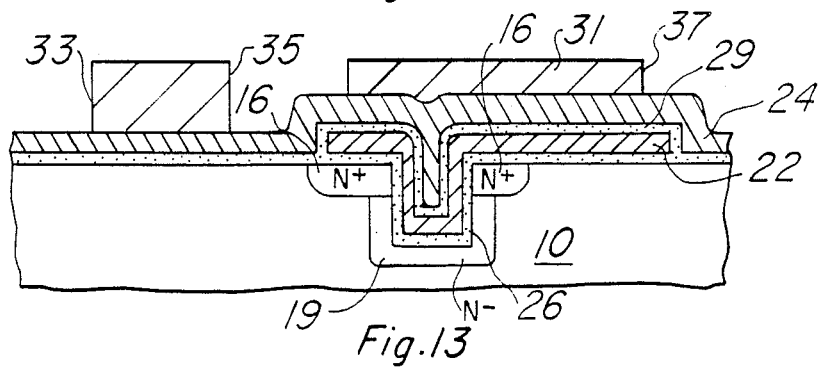
Figure 14:
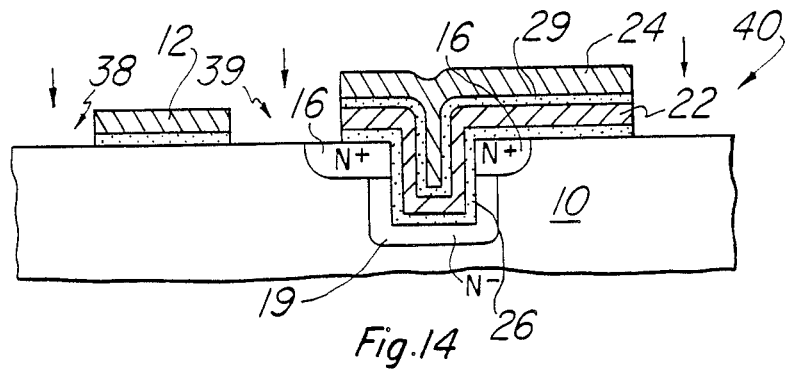
Figure 15:
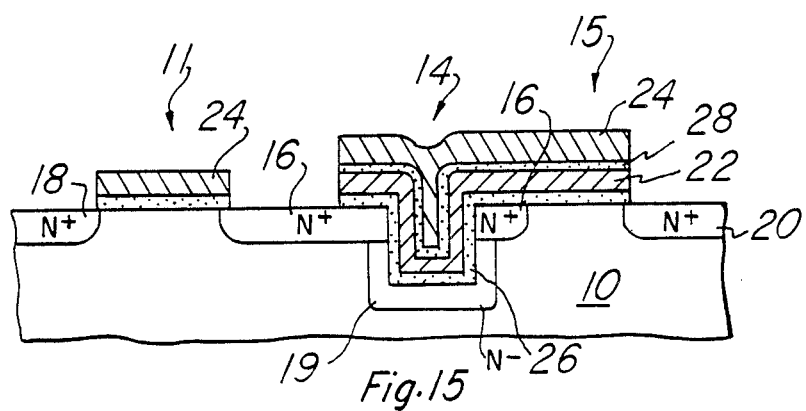

Next, as shown in FIG. 5, a layer of photoresist 27 is deposited and patterned to open a region 25 over the implanted N+ area 16. A trench 17 is then etched into the silicon substrate 10 through region 16 such that N+ region surrounds the trench as seen in FIG. 3. A region of substrate 10 surrounding the trench 17 is then subjected to doping from phosphorus oxychloride in a high temperature furnace to create an N− strip 19 adjacent the trench 17 extending from one N+ region 16 to another 16 on the opposite side of the trench 17. The nitride layer prevents doping anywhere except in the trench. After doping the oxide and nitride layers are removed. Another oxide layer 26 about 300 to 500 Angstroms thick is grown over the trench walls and silicon top surface. A low pressure chemical vapor deposition of polysilicon is made to conformally deposit about 0.4 microns of polysilicon 22 over the slice which is subsequently doped with phosphorus oxychloride in a high temperature furnace. The polysilicon 22 is then etched to dimensions slightly larger than its final dimensions and an interlevel oxide layer 29 of about 300 to 400 Angstroms is then formed over the polysilicon layer 22. A second polysilicon layer 24 similar to the first layer 22 is deposited and doped. A layer of photoresist 31 is then deposited and patterned to open regions 33, 35 and 37 as seen in FIG. 13. The polysilicon and underlying oxide is etched off in the aforesaid open regions 38, 39, and 40 and the open regions again implanted with arsenic to extend region 16 and form additional moat source/drain areas 18 and 20. The latter implant is again activated by heating. A subsequent passivation layer is then deposited and contacts formed (not shown).

By utilizing a phenomenon of tunnelling which more readily takes place at corners than across planar surfaces it is possible to use a relatively thick oxide layer 26 and still have tunnelling occur. This procedure improves data retention and allows easier process control of the gate oxide. However, it is possible to use a thin oxide of about 100 Angstroms thick over moat region 16 underneath polysilicon layer 22 and achieve tunnelling in the usual way.

FIG. 3 shows a layout in which the moat jogs after the trench. This is done to permit a more convenient contact placement to overlying conductor lines. However, it is obvious that a layout with no jog is possible.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A method of forming an electrically programmable read only memory cell on a semiconductor substrate, comprising:

forming a moat region of a first conductivity type in said substrate;

etching a trench through said moat region;

conformally depositing a pair of polysilicon layers over said trench and a portion of said substrate insulated from each other and said substrate by a selected thickness of insulator material;

wherein said polysilicon layers form a floating gate and a control gate for said floating gate transistor and bottom corners of said trench are sufficiently sharp such that tunnelling between a corner region of said trench and said floating gate is enhanced over the likelihood of tunnelling between planar regions of said trench and said floating gate.

2. A method according to claim 1, wherein said polysilicon layers form a floating gate and control gate for a tunnel transistor coupled to a source of said floating gate transistor.

3. A method according to claim 2, including forming a selection transistor coupled in series with said floating gate transistor.

* * * * *